(12) United States Patent
Liu et al.

(10) Patent No.: US 8,558,637 B2
(45) Date of Patent: Oct. 15, 2013

(54) CIRCUIT DEVICE WITH SIGNAL LINE TRANSITION ELEMENT

(75) Inventors: Duixian Liu, West Chester, NY (US); Ho-Chung Chen, Taipei (TW); Brian Allan Floyd, Raleigh, NC (US)

(73) Assignees: Mediatek Inc., Science-Based Industrial Park, Hsin-Chu (TW); International Business Machines Corporation, Armonk, NY (US)

( * ) Notice: Subject to any disclaimer, the term of this patent is extended or adjusted under 35 U.S.C. 154(b) by 361 days.

(21) Appl. No.: 12/778,130

(22) Filed: May 12, 2010

(65) Prior Publication Data
US 2011/0279190 A1 Nov. 17, 2011

(51) Int. Cl.
*H03H 7/38* (2006.01)

(52) U.S. Cl.
USPC .............................................. 333/33; 333/238

(58) Field of Classification Search
USPC ............................................. 333/33, 238, 246
See application file for complete search history.

(56) References Cited

U.S. PATENT DOCUMENTS

| 4,532,483 | A | 7/1985 | Schminke |
| 5,057,798 | A * | 10/1991 | Moye et al. ...................... 333/33 |
| 6,661,316 | B2 * | 12/2003 | Hreish et al. ................... 333/246 |
| 6,856,210 | B2 | 2/2005 | Zhu |
| 7,030,712 | B2 * | 4/2006 | Brunette et al. ................. 333/33 |
| 7,102,458 | B2 * | 9/2006 | Koriyama et al. .............. 333/26 |
| 7,692,590 | B2 | 4/2010 | Floyd |
| 7,696,930 | B2 | 4/2010 | Akkermans |
| 8,269,671 | B2 | 9/2012 | Chen |
| 2003/0151551 | A1 | 8/2003 | Chen |
| 2004/0231872 | A1 | 11/2004 | Arnold |
| 2007/0080864 | A1 | 4/2007 | Channabasappa |
| 2010/0001906 | A1 | 1/2010 | Akkermans |

FOREIGN PATENT DOCUMENTS

| JP | H05299906 A | 11/1993 |
| JP | 200068716 A | 3/2000 |
| JP | 2001308547 A | 11/2001 |
| JP | 2009111658 A | 5/2009 |

OTHER PUBLICATIONS

H-C Chen, D. Liu, and B. Floyd, "Simple radio frequency integrated circuit (RFIC) packages with integrated antennas", U.S. Appl. No. 12/360,538, filed Jan. 2009.

International application No. PCT/US2010/035491, International filed: May 20, 2010, International Search Report mailing date: Jul. 26, 2010.

* cited by examiner

*Primary Examiner* — Stephen Jones
(74) *Attorney, Agent, or Firm* — Winston Hsu; Scott Margo

(57) ABSTRACT

A circuit device includes a multilayer circuit carrier, a first signal transmission line, a second signal transmission line, a signal line transition element, a first impedance transformer, and a second impedance transformer. The multilayer circuit carrier includes a first layer and a second layer. The first signal transmission line is on the surface of the first layer. The second signal transmission line is on the surface of the second layer. The signal line transition element passes through the first layer and the second layer, and has a first signal terminal and a second signal terminal. The first impedance transformer is on the surface of the first layer and electrically connected between the first signal transmission line and the first signal terminal. The second impedance transformer is on the surface of the second layer and electrically connected between the second signal transmission line and the second signal terminal.

19 Claims, 21 Drawing Sheets

CIRCUIT DEVICE WITH SIGNAL LINE TRANSITION ELEMENT

BACKGROUND

The disclosed embodiments of the present invention relate to transmitting high-frequency signals, and more particularly, to a circuit device with a signal line transition element which passes signals through multiple layers of a multilayer circuit carrier and with impedance transformers electrically connected to signal terminals of the signal line transition element.

In a wireless network, the connectivity and communication between devices is achieved through antennas attached to receivers or transmitters in order to radiate the desired signals to or receive the desired signals from other elements of the wireless network. In radio communication systems, such as millimeter-wave radios, discrete components are usually assembled with low integration levels. These systems are often assembled using expensive and bulky waveguides and package-level or board-level microstrip structures to interconnect semiconductor elements and their required transmitter/receiver antennas. With recent progress in the semiconductor technology and packaging engineering, the dimensions of these radio communication systems become smaller and the integration of antennas with their radio-frequency (RF) front-end circuits becomes more desirable. For a specific application such as a wireless universal serial bus (USB) application, the operating distance is limited to about one meter, and a single antenna with about 7 dBi at 60 GHz will provide the necessary antenna gain. For one point-to-point application (such as a wireless video application) which has an operating distance as long as 10 meters or another point-to-point application (such as a radar application) which has an operating distance longer than 10 meters, an antenna gain as high as 30 dBi, depending on the actual application, is required. However, a high gain antenna generally has a very narrow beam width, so pointing the antenna is very difficult for consumers. Therefore, a radiation pattern steerable array (also called phased array) is necessary. For example, phased arrays are widely used in military radars. However, packaging an RF die with an integrated antenna or antenna array is extremely difficult and very expensive due to expensive components and extensive labor involved.

Thus, there is a need for an innovative assembly design of wireless communication elements.

SUMMARY

In accordance with exemplary embodiments of the present invention, a circuit device with a signal line transition element (e.g., signal via) which passes high-frequency signals through multiple layers of a multilayer circuit carrier (e.g., a package having an integrated antenna or antenna array) and impedance transformers electrically connected to signal terminals of the signal line transition element is proposed.

According to an aspect of the present invention, an exemplary circuit device is proposed. The exemplary circuit device includes a multilayer circuit carrier, a first signal transmission line, a second signal transmission line, a signal line transition element, a first impedance transformer, and a second impedance transformer. The multilayer circuit carrier has a plurality of layers including a first layer and a second layer. The first signal transmission line is disposed on the surface of the first layer. The second signal transmission line is disposed on the surface of the second layer. The signal line transition element passes through at least the first layer and the second layer, and has a first signal terminal on the first layer and a second signal terminal on the second layer. The first impedance transformer is disposed on the surface of the first layer and electrically connected between the first signal transmission line and the first signal terminal, for providing impedance matching between the first signal transmission line and the signal line transition element. The second impedance transformer is disposed on the surface of the second layer and electrically connected between the second signal transmission line and the second signal terminal, for providing impedance matching between the second signal transmission line and the signal line transition element.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "electrically connected" is intended to mean either an indirect or direct electrical connection. Accordingly, if one device is electrically connected to another device, that connection may be through a direct electrical connection, or through an indirect electrical connection via other devices and connections.

The conception of the present invention is to provide a multilayer signal line transition design, such as a multilayer vertical transition design for transmitting signals with frequencies within or above the millimeter wave (mmWave) range. For example, an exemplary embodiment of the present invention proposes a circuit device with a signal line transition element which passes signals through multiple layers (e.g., substrate layers) of a multilayer circuit carrier and has two signal terminals respectively electrically connected to impedance transformers. In this way, a low-cost circuit device (e.g., a low-cost package) with integrated antenna(s) and/or semiconductor die(s) may be realized with a minimal impact on the antenna performance. In addition, the proposed circuit device is consistent with the printed circuit board (PCB) manufacturing process or the low temperature co-fired ceramics (LTCC) manufacturing process, etc. Further details of the proposed circuit device will be described as follows.

Figure 1:
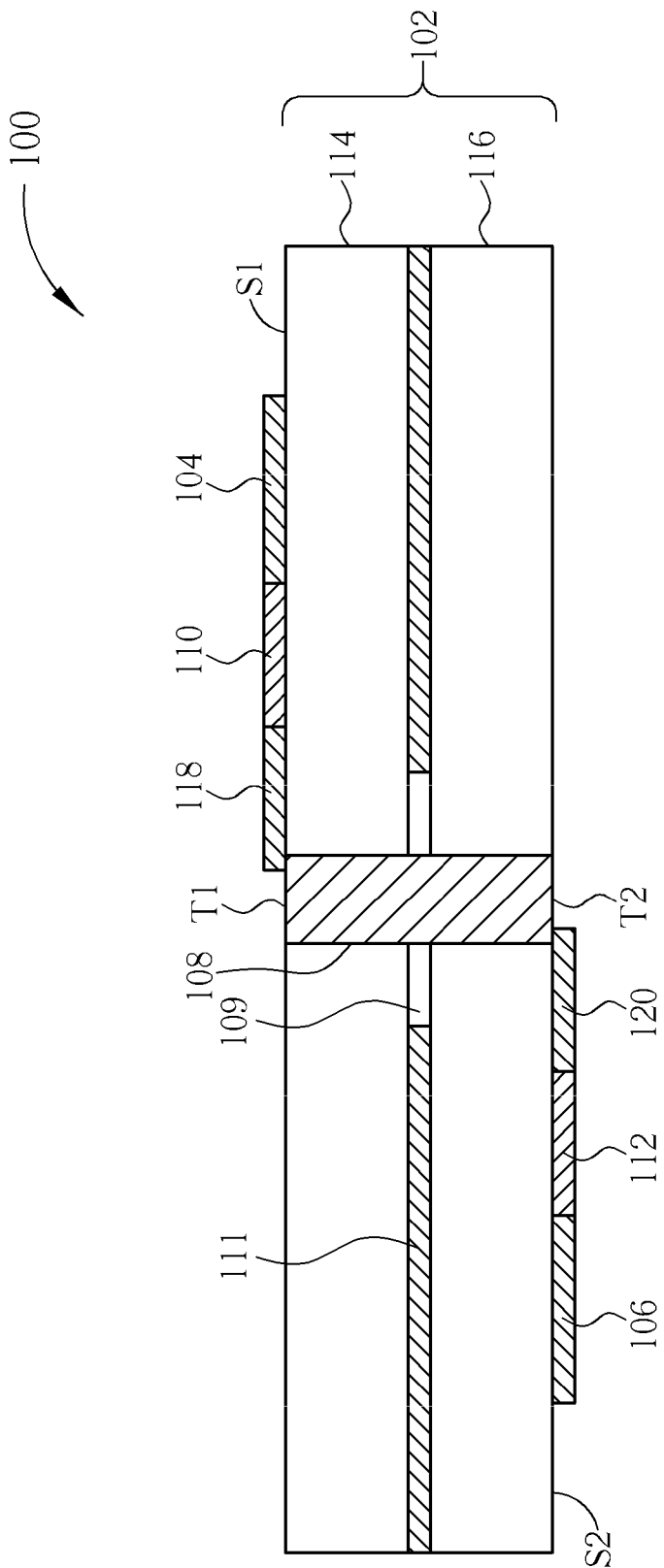
FIG. 1 is a cross-sectional view of a circuit device according to a first exemplary embodiment of the present invention.
Figure 2:
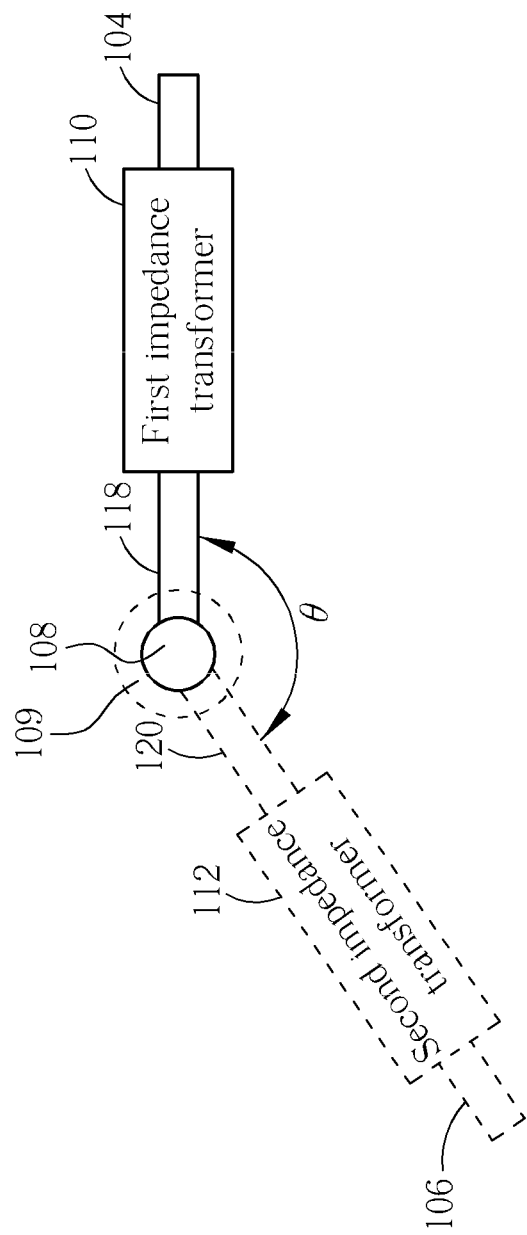
FIG. 2 is a top view of the exemplary circuit device shown in FIG. 1.

Please refer to FIG. 1 in conjunction with FIG. 2. FIG. 1 is a cross-sectional view of a circuit device according to a first exemplary embodiment of the present invention. FIG. 2 is a top view of the exemplary circuit device shown in FIG. 1. The exemplary circuit device 100 includes, but is not limited to, a multilayer circuit carrier 102, a first signal transmission line 104, a second signal transmission line 106, a signal line transition element 108, a first impedance transformer 110, and a second impedance transformer 112. The multilayer circuit carrier 102 has a plurality of layers including a first layer 114 and a second layer 116. It should be noted that only two layers are shown in FIG. 1 for illustrative purposes only, and the total number of layers included in the multilayer circuit carrier 102 depends upon the actual design consideration. The first signal transmission line 104 has impedance such as 50 Ohms, and is disposed on a surface Si of the first layer 114. The second signal transmission line 106 has impedance such as 50 Ohms, and disposed on a surface S2 of the second layer 116. The signal line transition element 108 passes through at least the first layer 114 and the second layer 116 included in the multilayer circuit carrier 102, and has a first signal terminal Ti on the first layer 114 and a second signal terminal T2 on the second layer 116. For example, the signal line transition element 108 may be implemented by an electrically conductive element (e.g., a signal via) passing through the first layer 114 and the second layer 116 in a thickness direction of the multilayer circuit carrier 102. It should be noted that the signal via may be formed by any available process. For example, if the PCB manufacturing process is employed, the signal via may be realized by a plated hole without any metal material filled therein. However, if the LTCC manufacturing process is employed, the signal via may be realized by a hole filled with a metal material (e.g., Ag, Cu, or Au). To put it simply, provided that the objective of providing vertical signal transmission is achieved, any via structure may be employed to realize the desired signal via. The first impedance transformer 110 is disposed on the surface S1 of the first layer 114 and electrically connected between the first signal transmission line 104 and the first signal terminal T1 of the signal line transition element 108, and implemented for providing impedance matching between the first signal transmission line 104 and the signal line transition element 108. The second impedance transformer 112 is disposed on the surface S2 of the second layer 116 and electrically connected between the second signal transmission line 106 and the second signal terminal T2 of the signal line transition element 108, and implemented for providing impedance matching between the second signal transmission line 106 and the signal line transition element 108.

As the signal line transition element 108 may not have the desired impedance (e.g., 50 Ohms), the first impedance transformer 110 and the second impedance transformer 112 are therefore used for acting as impedance matching networks to make the antenna feed impedance, typically 50 Ohms, not change through the non-ideal signal line transition element 108. In this way, the signal transmission performance is improved by reducing undesired signal loss. In addition, as the first signal transmission line 104 and the second signal transmission line 106 are disposed on different layers, respectively, the angle θ between the first signal transmission line 104 and the second signal transmission line 106 is arbitrary. Thus, the signal line transition can be designed in a systematic way and the signal routing layout is very flexible, which can easily meet the requirements of any application.

It should be noted that there are one optional short line segment 118 electrically connected between the first impedance transformer 110 and the signal line transition element 108 and another optional short line segment 120 electrically connected between the second impedance transformer 112 and the signal line transition element 108. The line length of each short line segment can be adjusted so that the line impedance viewed at the impedance transformer is purely real. However, in an alternative design, the short line segments 118 and 120 each having a variable length may be omitted. Therefore, the first impedance transformer 110 may be directly connected to the first signal terminal T1 of the signal line transition element 108, and the second impedance transformer 112 may be directly connected to the second signal terminal T2 of the signal line transition element 108.

The first signal transmission line 104, the first impedance transformer 110, and the optional short line segment 118 may be routed on one metal layer on the surface S1 of the first layer 114, and the second signal transmission line 106, the second impedance transformer 112, and the optional short line segment 120 may be routed on another metal layer on the surface S2 of the second layer 116. However, it is possible to replace the first layer 114 with more layers for allowing more functions to be realized by using the circuit device 100. Besides, it is also possible to replace the second layer 116 with more layers or different materials. For example, an additional metal layer can be added to reduce the crowdedness of input/output pads formed on the surface S2, thereby simplifying the interface design between the circuit device 100 and a semiconductor die to be mounted onto the circuit device 100.

To further reduce undesired signal loss for improving the signal transmission performance, the electromagnetic shielding technique may be employed. For example, the signal line transition element 108 may be implemented by a coaxial-like transmission line, and/or the signal line transition element 108 passes through at least one reference voltage plane which is disposed on one of the layers included in the multilayer circuit carrier 102 and arranged to deliver a predetermined reference voltage such as a power supply voltage or a ground voltage. As the signal line transition element 108 is intended for signal conveyance, any physical signal conveyance element (e.g., a signal via) of the signal line transition element 108 is isolated from the reference voltage plane(s) when passing through the reference voltage plane(s). For example, a reference voltage plane 111 may be formed between the first layer 114 and the second layer 116. In this exemplary embodiment, an area surrounding the signal line transition element 108 is free of the conductive plane material and therefore serves as an anti-pad 109. It should be noted that using the signal line transition element 108 to pass signals through the reference voltage plane 111 is for illustrative purposes only, and is not meant to be a limitation of the present invention.

The coaxial-like transmission line has an inner conductor surrounded by a conductive shielding structure. In this way, when the proposed circuit device is employed in a high-frequency application (e.g., a mmWave application), the signal loss due to undesired radiation can be avoided/reduced by the conductive shielding structure. Similarly, as the reference voltage plane, such as a power plane or a ground plane, is DC-shorted under a high-frequency operational environment, the signal loss due to the undesired radiation may be reduced by the reference voltage plane, too. To put it simply, when the coaxial-like transmission line which provides an outside shield is employed, the proposed multilayer signal line transition design has very good performance, almost independent of the layer thickness.

Figure 3:
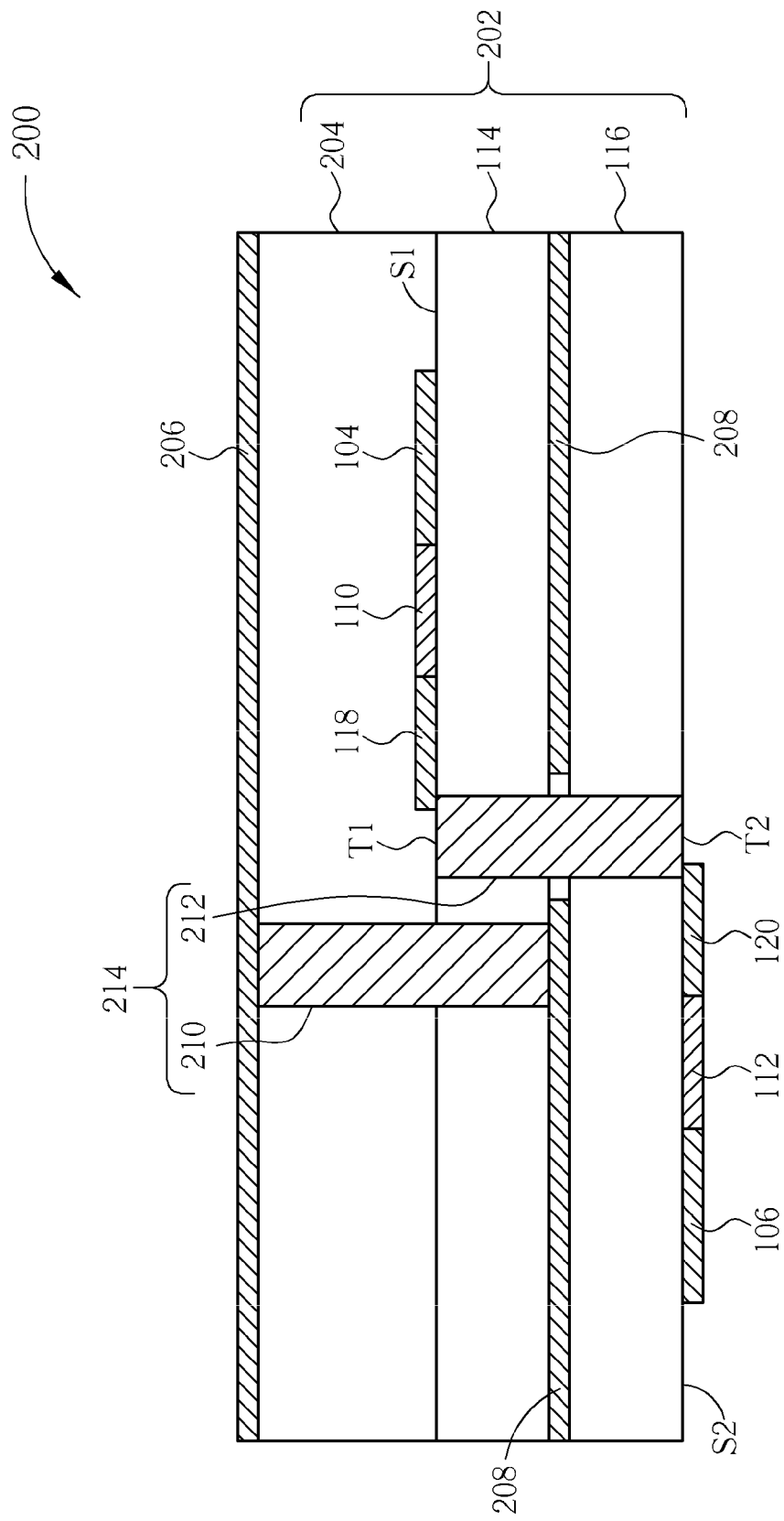
FIG. 3 is a cross-sectional view of a circuit device according to a second exemplary embodiment of the present invention.
Figure 4:
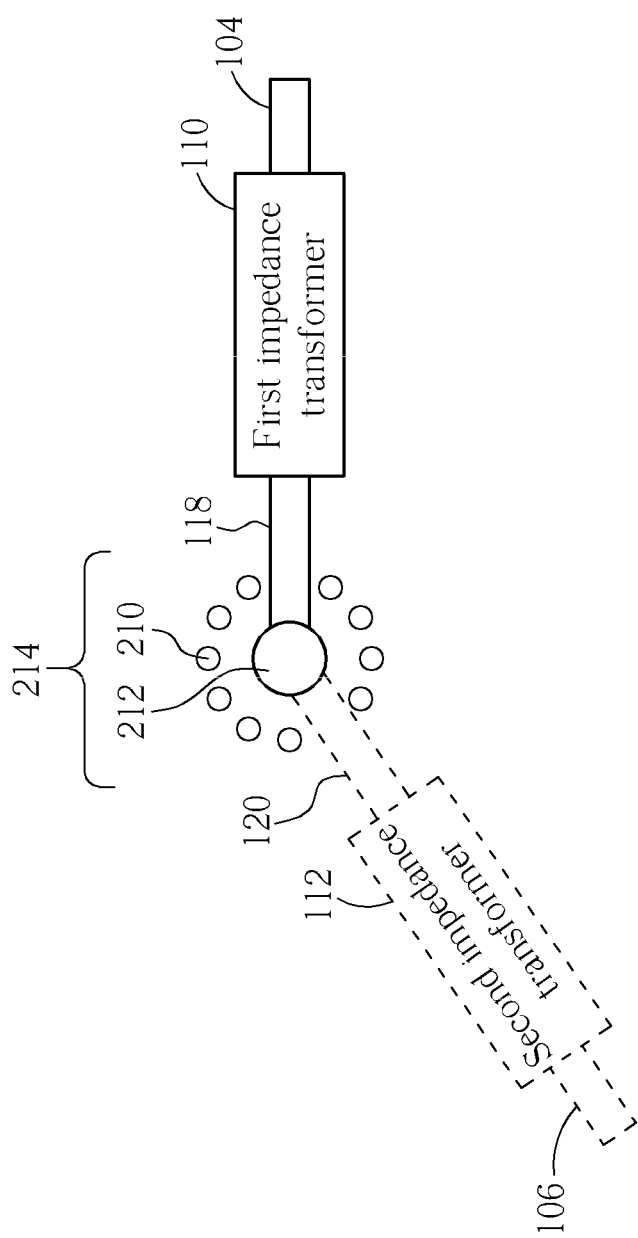
FIG. 4 is a top view of the exemplary circuit device shown in FIG. 3.
Figure 5:
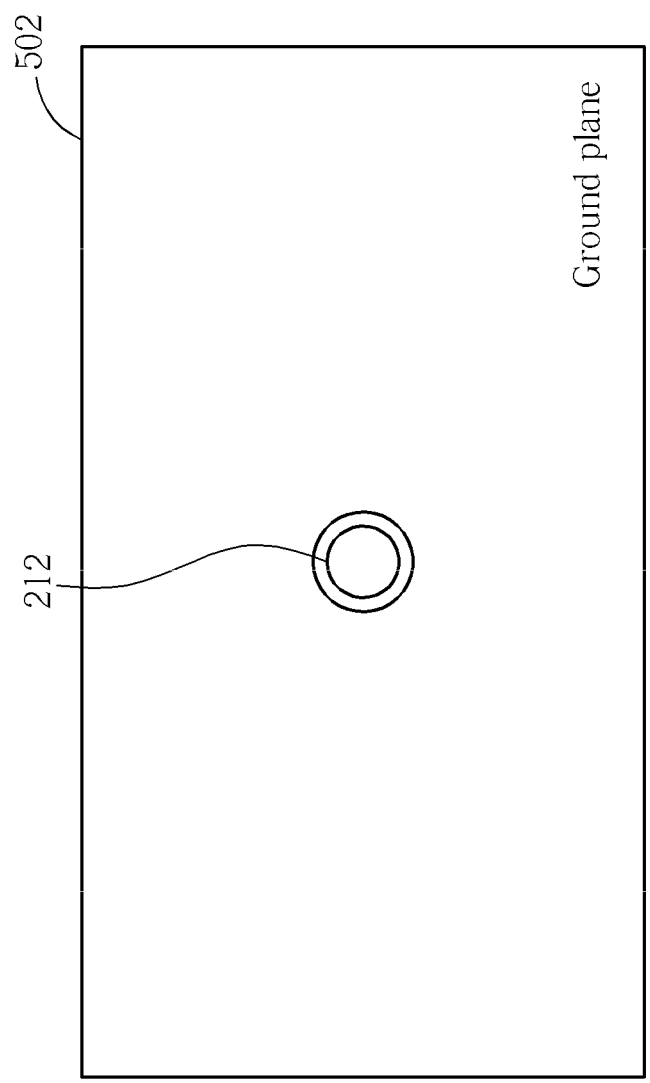
FIG. 5 is a top view illustrating a signal via passing through a ground plane.

Please refer to FIG. 3 in conjunction with FIG. 4. FIG. 3 is a cross-sectional view of a circuit device according to a second exemplary embodiment of the present invention. FIG. 4 is a top view of the exemplary circuit device shown in FIG. 3. The circuit device 200 has the similar structure shown in FIG. 1 and additional elements implemented therein. In this exemplary embodiment, the multilayer circuit carrier 202 includes the first layer 114, the second layer 116, and a third layer 204 above the first layer 114. It should be noted that only three layers are shown here for illustrative purposes only. In addition, one reference voltage plane 206 is disposed on the third layer 204 and arranged to deliver a predetermined reference voltage, and another reference voltage plane 208 is disposed between the first layer 114 and the second layer 116, and is arranged to deliver a predetermined reference voltage. By way of example, but not limitation, the reference voltage plane 206 may be an antenna ground plane of an antenna (not shown), and the reference voltage plane 208 may be a ground plane of a semiconductor die or other circuitry (not shown). Moreover, the signal line transition element 214 is a coaxial-like transmission line realized by a signal via 212 and a plurality of shielding vias 210 disposed around the signal via 212. It should be noted that the shielding via may be formed by any available process. For example, if the PCB manufacturing process is employed, the shielding via may be realized by a plated hole without any stuff filled therein. However, if the LTCC manufacturing process is employed, the shielding via may be realized by a hole filled with a metal material (e.g., Ag, Cu, or Au). To put it simply, provided that the objective of shielding the signal via is achieved, any via structure may be employed to realize the desired shielding via. As shown in FIG. 3, the signal via 212 passes through at least the first layer 114 and the second layer 116 in the thickness direction of the multilayer circuit carrier 202. In other words, the signal via 212 provides a vertical transmission path. In addition, as can be seen from FIG. 3, two ends of the signal via 212 serve as the first signal terminal T1 and the second signal terminal T2 of the signal line transition element 214, respectively. Each of the shielding vias 210 is connected between the reference voltage planes 206 and 208 and utilized for transmitting a predetermined reference voltage. For example, provided that the reference voltage planes 206 and 208 are both ground planes, each shielding via 210 acts as a grounded via. Please refer to FIG. 5, which is a top view illustrating the signal via 212 passing through a ground plane 502 such as the reference voltage planes 208 in FIG. 3. As mentioned above, any physical signal conveyance element (e.g., a signal via) of the signal line transition element is isolated from the reference voltage plane(s) when passing through the reference voltage plane(s). Therefore, as can be seen from FIG. 3, the signal via 212 is not electrically connected to the ground plane 502 when passing through the ground plane 502.

Figure 6:
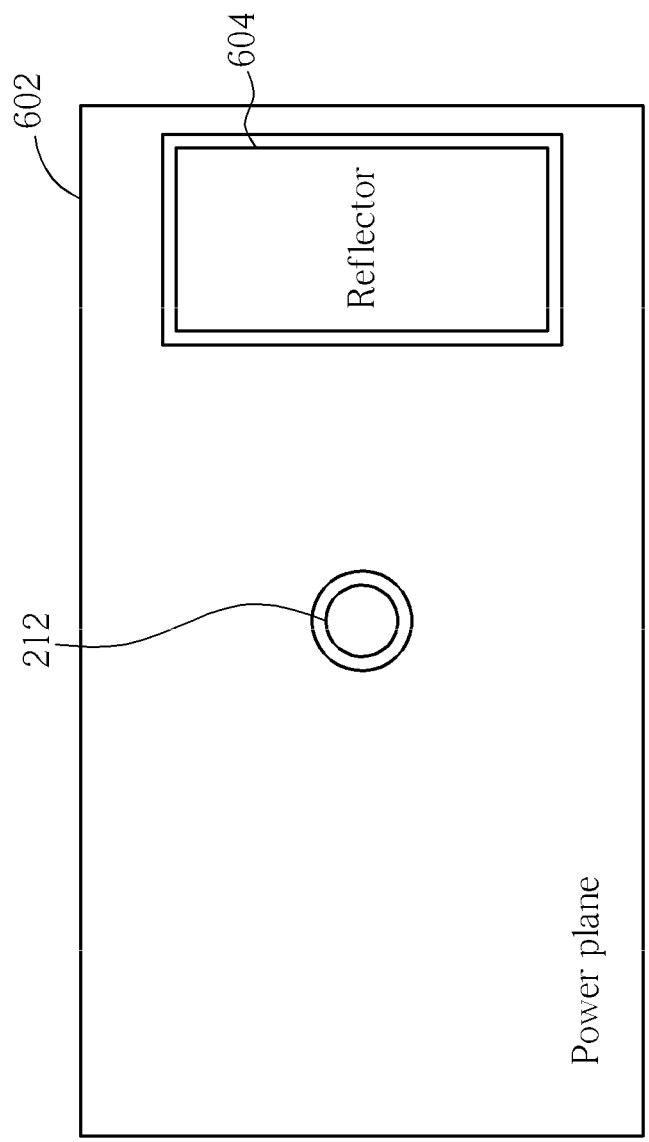
FIG. 6 is a top view illustrating a signal via passing through a power plane.

It should be noted that the reference voltage plane, either a ground plane or a power plane, is DC-shorted under the high-frequency operational environment. Thus, regarding a high-frequency application, the reference voltage plane 208 may also be a power plane. Please refer to FIG. 6, which is a top view illustrating the signal via 212 passing through a power plane 602 such as the reference voltage planes 208 shown in FIG. 3. In a case where the circuit device 200 shown in FIG. 3 is employed to carry an antenna (not shown) of the high-frequency application, a reflector 604 for reducing the back radiation may be disposed at an internal cut area of the power plane 602. However, this is for illustrative purposes only. In an alternative design, the reflector 604 may be removed from the internal area of the power plane 602, and placed on another layer of the multilayer circuit carrier 202 (e.g., disposed between the power plane 602 and the first signal transmission line 104 which acts as an antenna feed line). Alternatively, the reflector 604 may be removed from the internal area of the power plane 602, and the power plane 602 itself functions as the reflector for the antenna to reduce the back radiation. As mentioned above, any physical signal conveyance element (e.g., a signal via) of the signal line transition element is isolated from the reference voltage plane(s) when passing through the reference voltage plane(s). Therefore, as can be seen from FIG. 6, the signal via 212 is not electrically connected to the power plane 602 when passing through the power plane 602.

Figure 7:
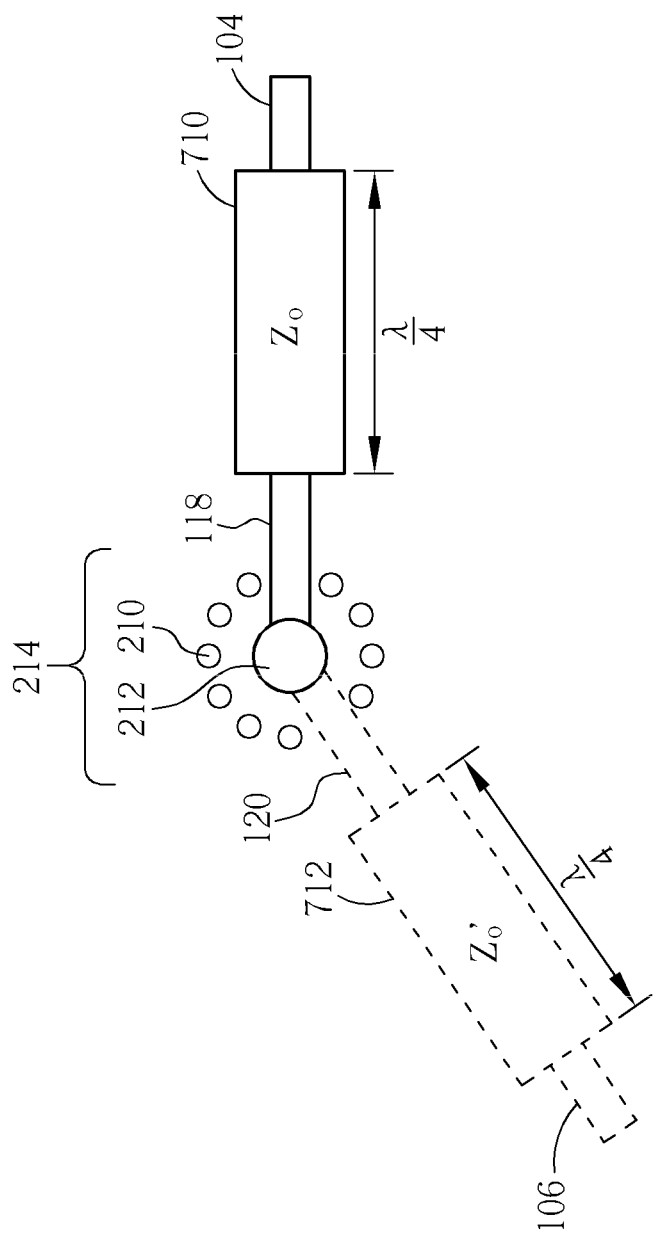
FIG. 7 is a diagram illustrating impedance transformers implemented by quarter wavelength transformers.

At least one of the first impedance transformer 110 and the second impedance transformer 112 may be implemented by a quarter wavelength transformer. Taking the circuit device 200 shown in FIG. 3 for example, the first impedance transformer 110 and the second impedance transformer 112 respectively implemented by quarter wavelength transformers 710 and 712 are shown in FIG. 7. Each of the first signal transmission line 104 and the second signal transmission line 106 has impedance $Z_S$. For example, the impedance $Z_S$ is purely real impedance $R_S$, such as 50 Ohms. If the impedance of the signal line transition element 214 is a complex value, the length of the short line segment 118 may be properly set to convert the complex input impedance into purely real impedance $R_L$ viewed by the quarter wavelength transformer 710. However, if the impedance of the signal line transition element 214 is the purely real impedance $R_L$, the short line segment 118 can be omitted. The impedance $Z_0$ of the quarter wavelength transformer 710 can be simply determined according to the following equation.

$$Z_0 = \sqrt{R_S \cdot R_L} \quad (1)$$

In addition, the line length of the quarter wavelength transformer 710 is equal to $$\frac{\lambda}{4},$$

where λ is the wavelength of a transmitted sinusoidal signal (e.g., an RF signal), and can be easily determined according to the following equation.

$$\lambda = \frac{V}{f} \quad (2)$$

Regarding the transmission of the sinusoidal signal, V in above equation (2) represents the phase velocity (i.e., speed of light/$\sqrt{\epsilon_r}$, $3 \times 10^8$, $\sqrt{\epsilon_r}$ m/s), and f in above equation (2) represents the frequency of the sinusoidal signal to be transmitted. For example, regarding a mmWave application, the covered frequency range of the RF signal may be from 57 GHz to 66 GHz. Therefore, the line length of the quarter wavelength transformer 710 may be determined according to a middle value (i.e., 61.5 GHz) of the covered frequency range.

As a person skilled in the art can readily understand how to determine the impedance $Z_0'$ ($Z_0'$ may be identical to or different from $Z_0$) and the line length $$\frac{\lambda}{4}$$

of the other quarter wavelength transformer 712, further description is omitted here for brevity.

Figure 8:
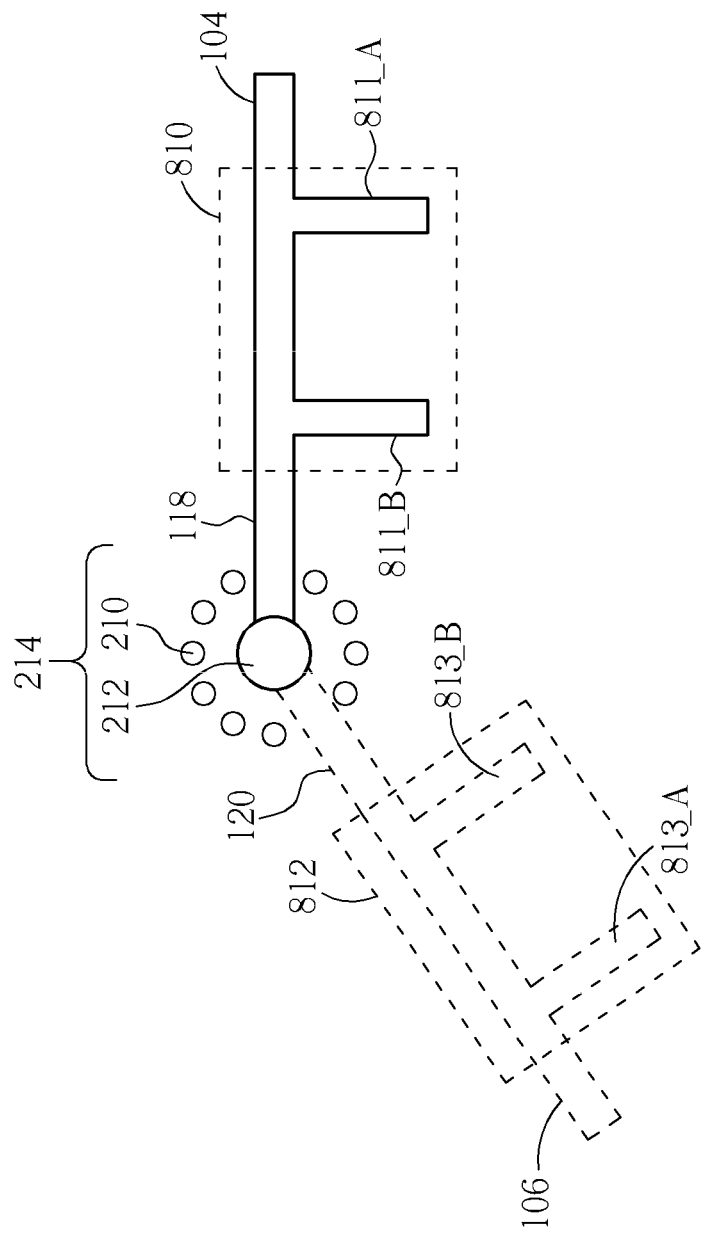
FIG. 8 is a diagram illustrating impedance transformers implemented by double-stub matching networks each having two open-circuited stubs.
Figure 9:
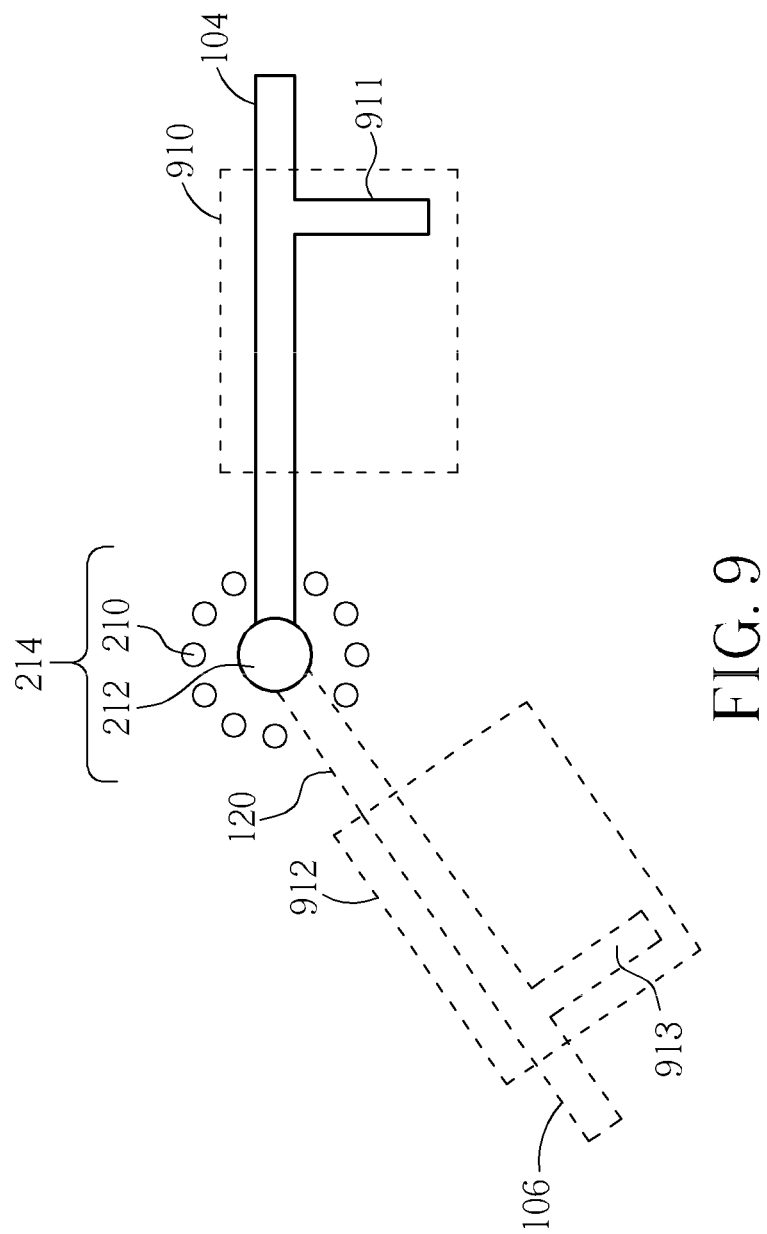
FIG. 9 is a diagram illustrating impedance transformers implemented by single-stub matching networks each having one open-circuited stub.

It should be noted that the implementation of the aforementioned impedance transformer is not limited to a quarter wavelength transformer. For example, in one alternative design, at least one of the first impedance transformer 110 and the second impedance transformer 112 may be implemented by a multi-stub matching network (e.g., a double-stub matching network) with a plurality of open-circuited stubs or a single-stub matching network with an open-circuited stub. Taking the circuit device 200 shown in FIG. 3 for example, the first impedance transformer 110 and the second impedance transformer 112 respectively implemented by double-stub matching networks 810 and 812 each having two open-circuited stubs 811_A and 811_B/813_A and 813_B are shown in FIG. 8, and the first impedance transformer 110 and the second impedance transformer 112 respectively implemented by single-stub matching networks 910 and 912 each having one open-circuited stub 911/913 are shown in FIG. 9. The same objective of providing the required impedance matching between the first signal transmission line 104/second signal transmission line 106 and the signal line transition element 214 is achieved.

Figure 10:
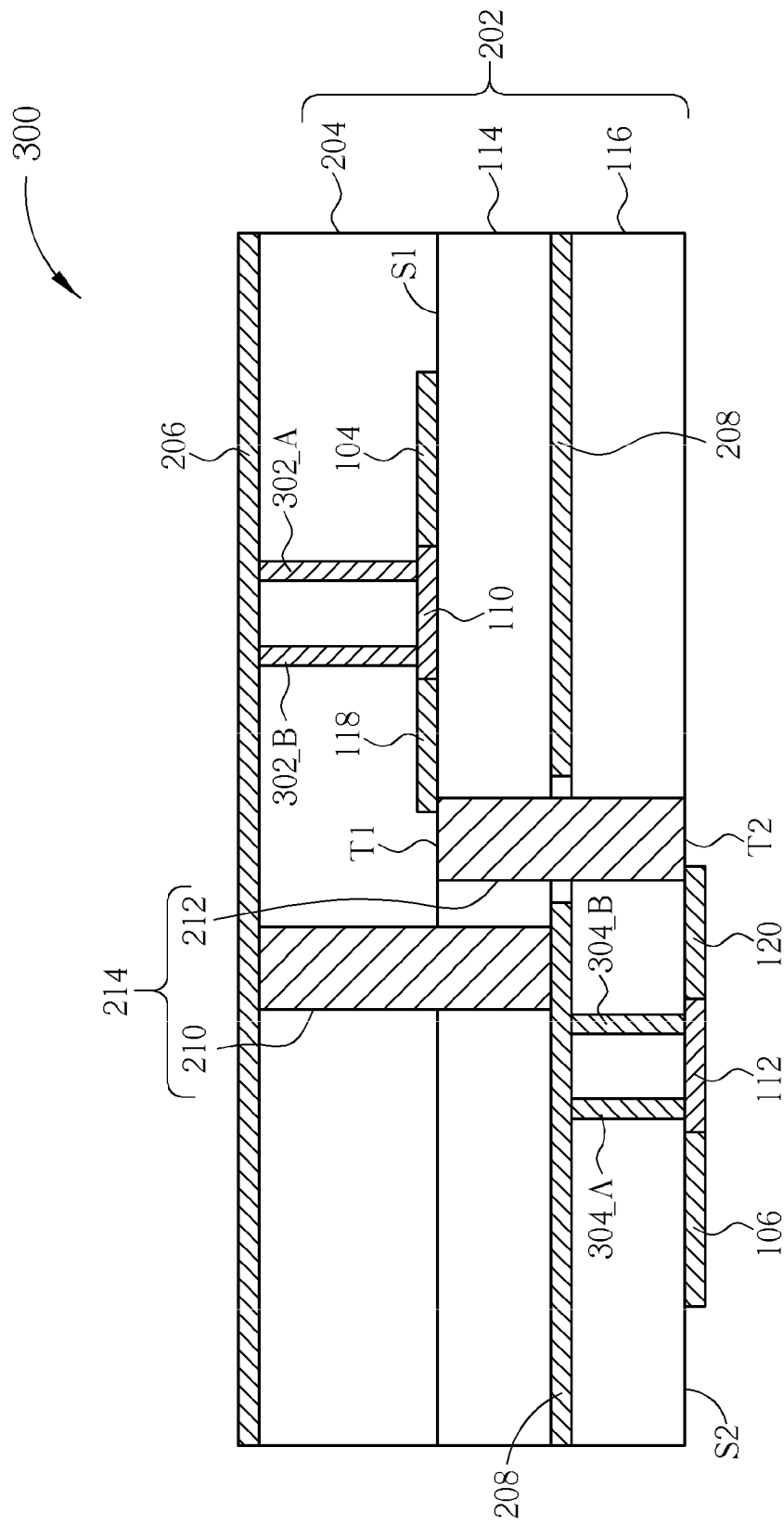
FIG. 10 is a cross-sectional view of a circuit device according to a third exemplary embodiment of the present invention.
Figure 11:
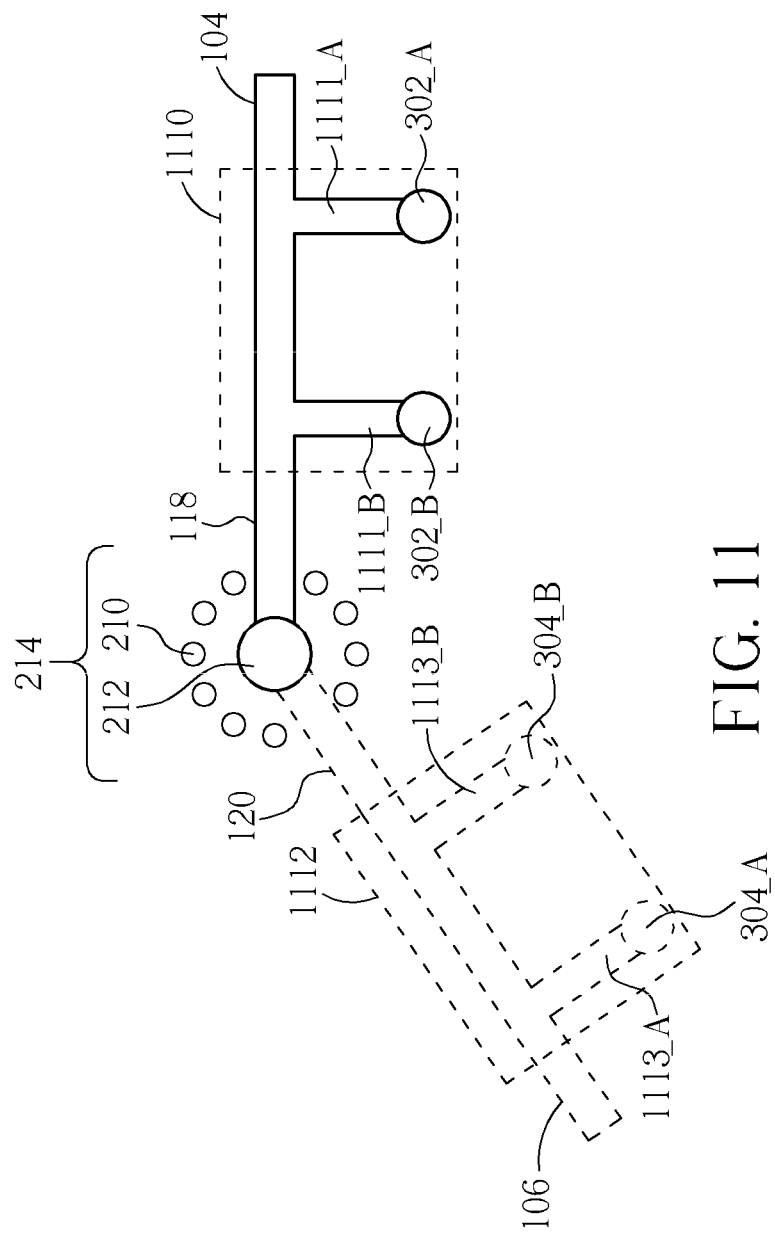
FIG. 11 is a top view of the exemplary circuit device shown in FIG. 10.
Figure 12:
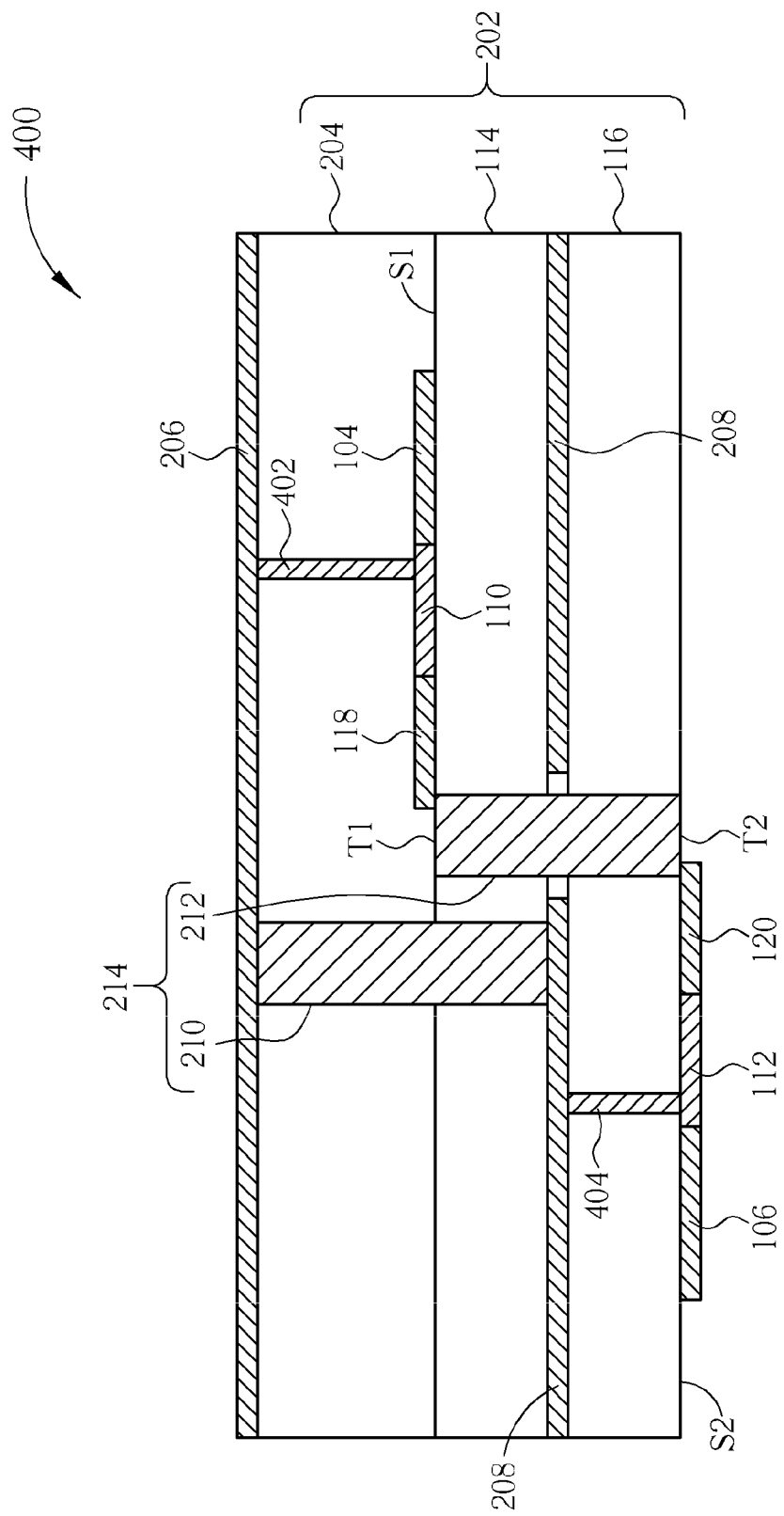
FIG. 12 is a cross-sectional view of a circuit device according to a fourth exemplary embodiment of the present invention.
Figure 13:
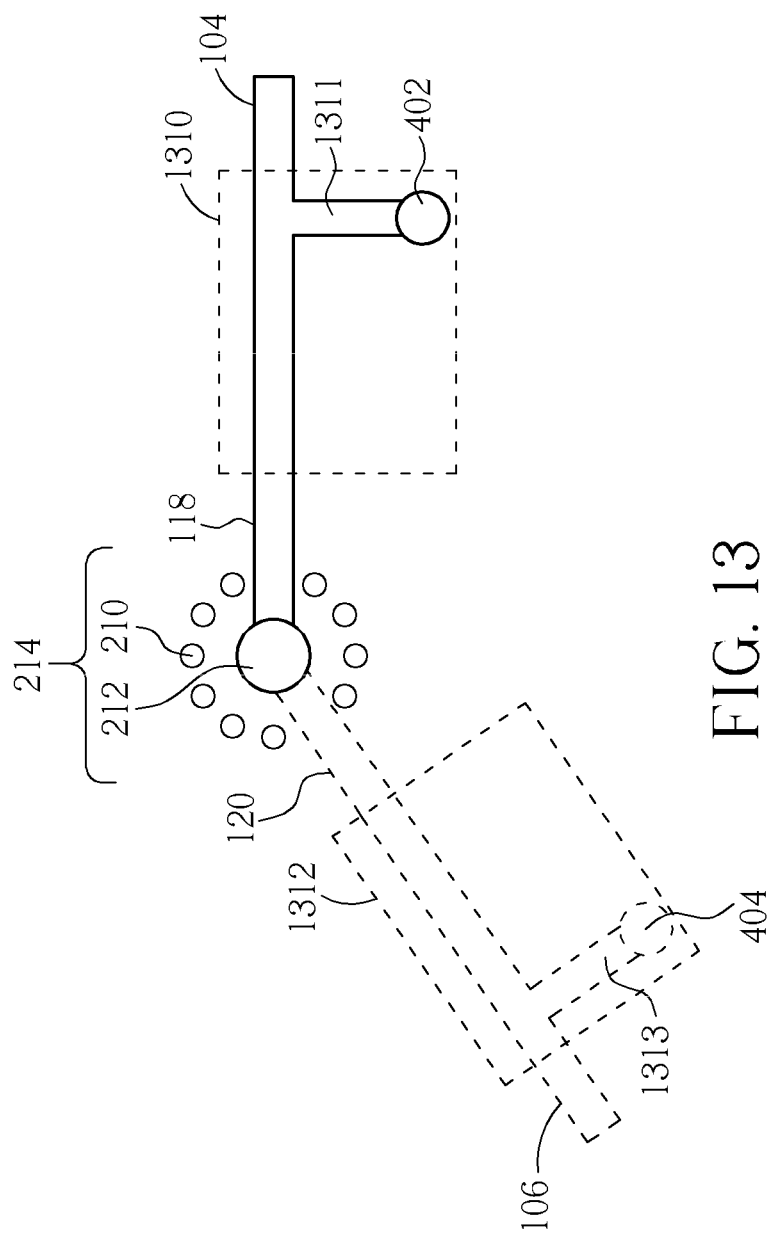
FIG. 13 is a top view of the exemplary circuit device shown in FIG. 12.

In another alternative design, at least one of the first impedance transformer 110 and the second impedance transformer 112 may be implemented by a multi-stub matching network (e.g., a double-stub matching network) with a plurality of short-circuited stubs or a single-stub matching network with a short-circuited stub. FIG. 10 is a cross-sectional view of a circuit device according to a third exemplary embodiment of the present invention. FIG. 11 is a top view of the exemplary circuit device shown in FIG. 10. FIG. 12 is a cross-sectional view of a circuit device according to a fourth exemplary embodiment of the present invention. FIG. 13 is a top view of the exemplary circuit device shown in FIG. 12. The major difference between the exemplary circuit device 300 in FIG. 10 and the exemplary circuit device 200 in FIG. 3 is that the first impedance transformer 110 is further electrically connected to the first reference voltage plane (e.g., a ground plane) 206 through short-circuited vias 302_A and 302_B, and the second impedance transformer 112 is further electrically connected to the second reference voltage plane (e.g., a ground plane) 208 through short-circuited vias 304_A and 304_B. Similarly, the major difference between the exemplary circuit device 400 in FIG. 12 and the exemplary circuit device 200 in FIG. 3 is that the first impedance transformer 110 is further electrically connected to the first reference voltage plane (e.g., a ground plane) 206 through a short-circuited via 402, and the second impedance transformer 112 is further electrically connected to the second reference voltage plane (e.g., a ground plane) 208 through a short-circuited via 404.

The aforementioned first impedance transformer 110 and the second impedance transformer 112 respectively implemented by double-stub matching networks 1110 and 1112 each having two short-circuited stubs 1111_A and 1111_B/1113_A and 1113_B are shown in FIG. 11, and the aforementioned first impedance transformer 110 and the second impedance transformer 112 respectively implemented by single-stub matching networks 1310 and 1312 each having one short-circuited stub 1311/1313 are shown in FIG. 13. The same objective of providing the required impedance matching between the first signal transmission line 104/second signal transmission line 106 and the signal line transition element 214 is achieved.

Please note that the above is for illustrative purposes, and the exemplary impedance transformer implementation may also be employed to realize at least one of the first impedance transformer 110 and the second impedance transformer 112 included in the circuit device 100 shown in FIG. 1. This also falls within the scope of the present invention.

Each of the exemplary circuit devices proposed above may have antenna(s) and/or semiconductor die(s) integrated therein. Therefore, the aforementioned first signal transmission line 104 may serve as an antenna feed line, and the aforementioned second signal transmission line 106 may be used to connect a mounted semiconductor die with an RF signal processing capability. By way of example, but not limitation, the exemplary circuit device of the present invention is suitable for a high-frequency application due to the particularly designed multilayer signal line transition design. In the following, some exemplary circuit devices each having an integrated antenna included therein are provided.

Figure 14:
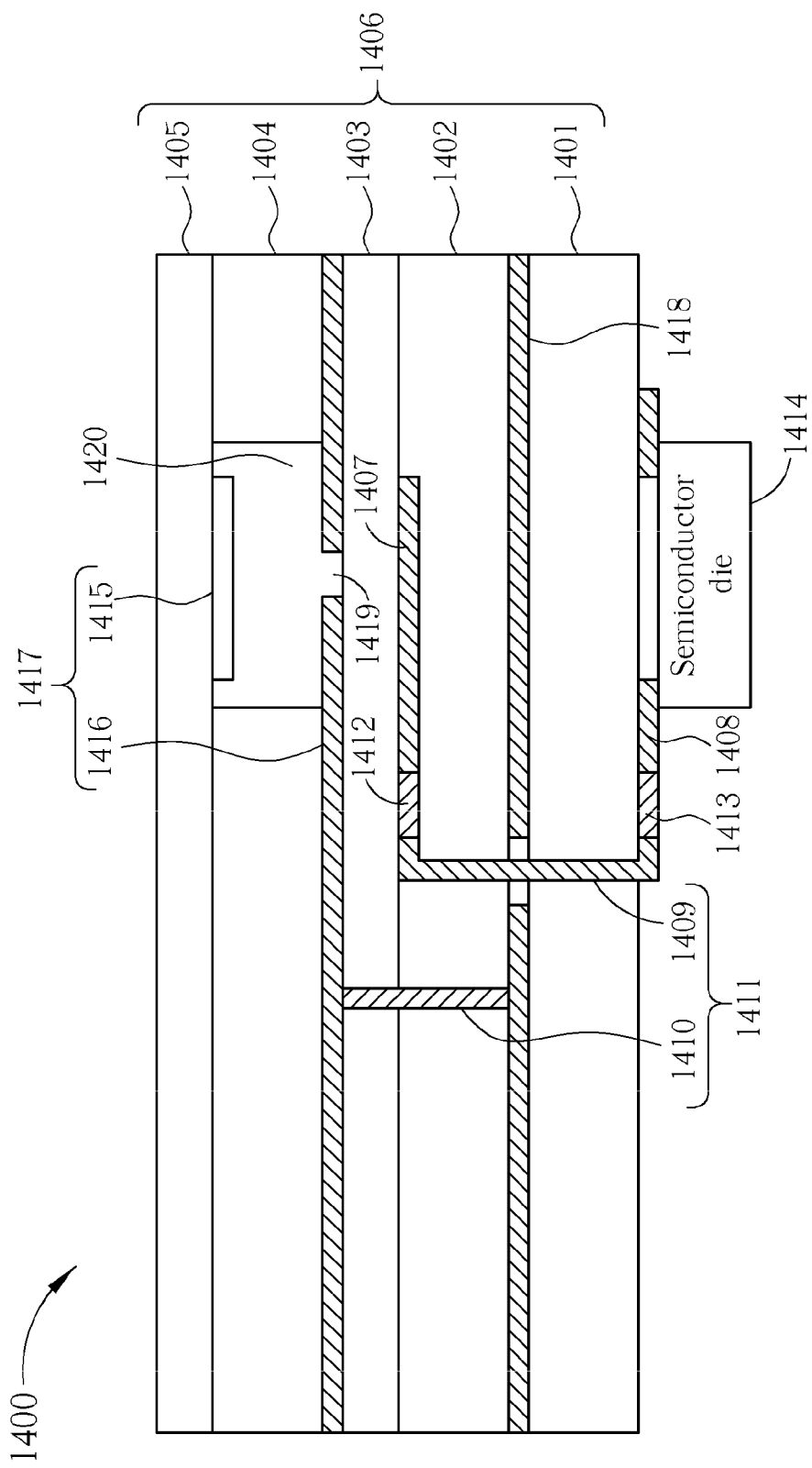
FIG. 14 is a cross-sectional view of a circuit device according to a fifth exemplary embodiment of the present invention.

FIG. 14 is a cross-sectional view of a circuit device according to a fifth exemplary embodiment of the present invention. The exemplary circuit device 1400 includes, but is not limited to, a multilayer circuit carrier 1406 including a plurality of layers 1401-1405, a first signal transmission line 1407 acting as an antenna feed line, a second signal transmission line 1408, a signal line transition element 1411 including a signal via 1409 and a plurality of shielding vias 1410, a first impedance transformer 1412, a second impedance transformer 1413, a semiconductor die (e.g., an RF die with at least the RF signal processing capability) 1414, a patch antenna 1417 including a patch 1415 and an antenna ground plane 1416, and a power plane 1418 with/without a reflector formed on the same layer. As a person skilled in the art can readily understand features of the multilayer signal line transition design shown in FIG. 14 after reading above paragraphs directed to the exemplary design shown in FIG. 3 and FIG. 4, further description is omitted here for brevity.

As shown in FIG. 14, the second signal transmission line 1408 and the semiconductor die 1414 are mounted on the same surface of the layer 1401. The semiconductor die 1414 is electrically connected to the second signal transmission line 1408 for transmitting or receiving signals (e.g., RF signals) between the multilayer circuit carrier 1406 and the semiconductor die 1414. For example, the semiconductor die 1414 is mounted onto the layer 1401 through a flip-chip bonding manner. In this exemplary embodiment, the patch antenna 1417 is an aperture-coupled patch antenna. Thus, the antenna ground plane 1416 disposed between the patch 1415 and the antenna feed line (i.e., the first signal transmission line 1407) has an aperture 1419 such that the patch 1415 is coupled to the antenna feed line through the aperture 1419. Moreover, the patch 1415 is accommodated in an internal cavity (e.g., an air cavity) of the multilayer circuit carrier 1406 for achieving better antenna performance.

However, if the antenna bandwidth requirement is not critical, a regular aperture-coupled patch antenna may be used. Please refer to FIG. 15, which is a cross-sectional view of a circuit device according to a sixth exemplary embodiment of the present invention. The exemplary circuit device 1500 has a multilayer circuit carrier 1505 including a plurality of layers 1501-1504. As can be seen from FIG. 15, no internal cavity for accommodating a patch 1515 of a patch antenna 1517 is formed in the multilayer circuit carrier 1505. Therefore, the production cost can be reduced since no internal cavity is needed.

Figure 15:
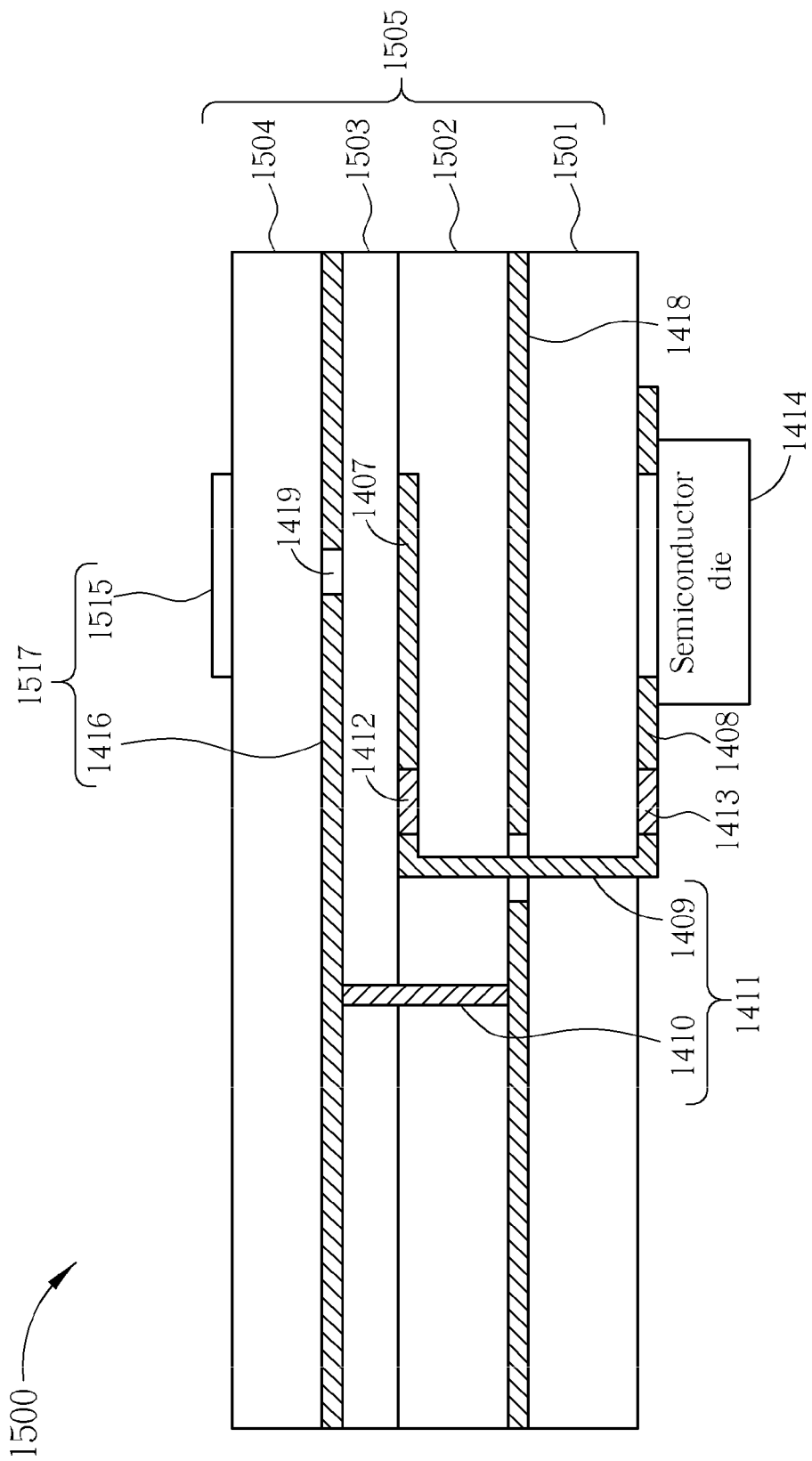
FIG. 15 is a cross-sectional view of a circuit device according to a sixth exemplary embodiment of the present invention.
Figure 16:
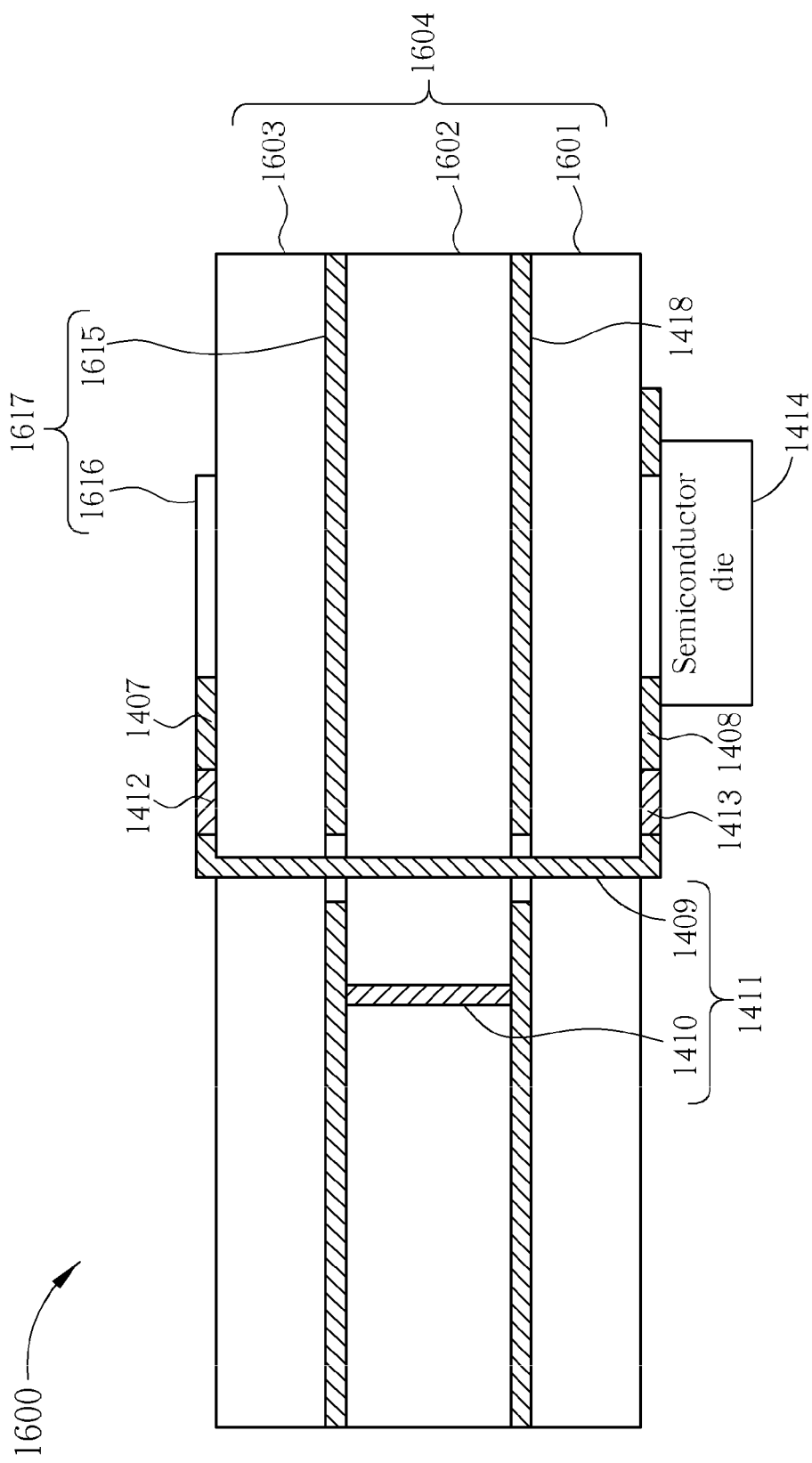
FIG. 16 is a cross-sectional view of a circuit device according to a seventh exemplary embodiment of the present invention.

In above exemplary embodiments shown in FIG. 14 and FIG. 15, aperture-coupled patch antennas are used. However, the multilayer circuit carrier may also be used to carry a regular patch antenna, such as an edge-fed patch antenna. Please refer to FIG. 16, which is a cross-sectional view of a circuit device according to a seventh exemplary embodiment of the present invention. The exemplary circuit device 1600 has a multilayer circuit carrier 1604 including a plurality of layers 1601-1603. The first signal transmission line 1407 and a patch 1616 of a patch antenna 1617 are both disposed on the same surface of the layer 1603. In addition, the first signal transmission line 1407 acts as an antenna feed line, and is directly connected to an edge of the patch 1616. As can be seen from FIG. 16, an antenna ground plane 1615 of the patch antenna 1617 is disposed below the patch 1616 without any aperture formed therein.

Figure 17:
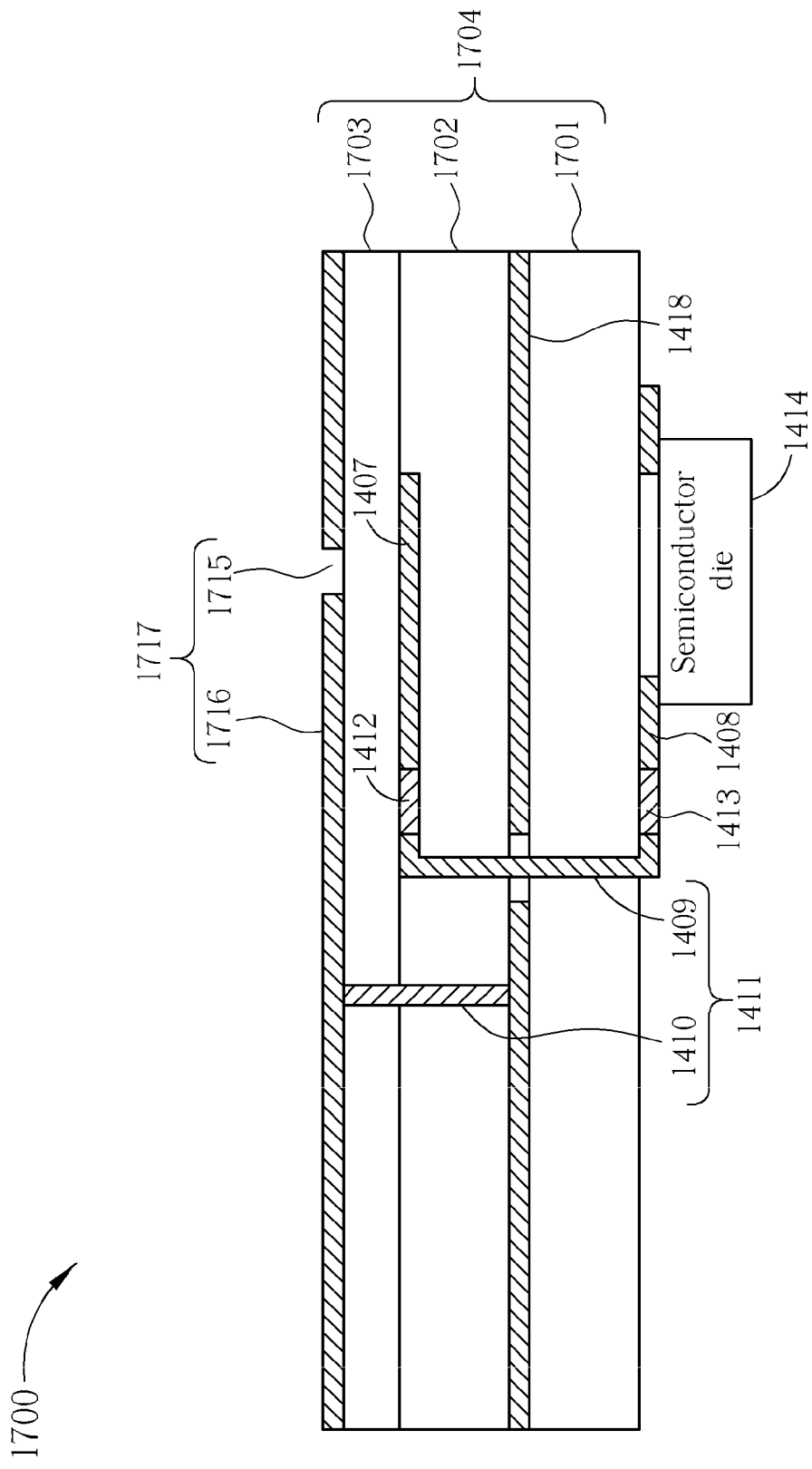
FIG. 17 is a cross-sectional view of a circuit device according to an eighth exemplary embodiment of the present invention.

Please note that patch antenna is not the only one antenna structure that can be integrated with the proposed circuit device. Please refer to FIG. 17, which is a cross-sectional view of a circuit device according to an eighth exemplary embodiment of the present invention. The exemplary circuit device 1700 has a multilayer circuit carrier 1704 including a plurality of layers 1701-1703. As shown in FIG. 17, a slot antenna 1717 is formed on the surface of the layer 1703, where the slot antenna 1717 has a slot 1715 which is formed in an antenna ground plane 1716 of the slot antenna 1717 and serves as a radiating element.

Figure 18:
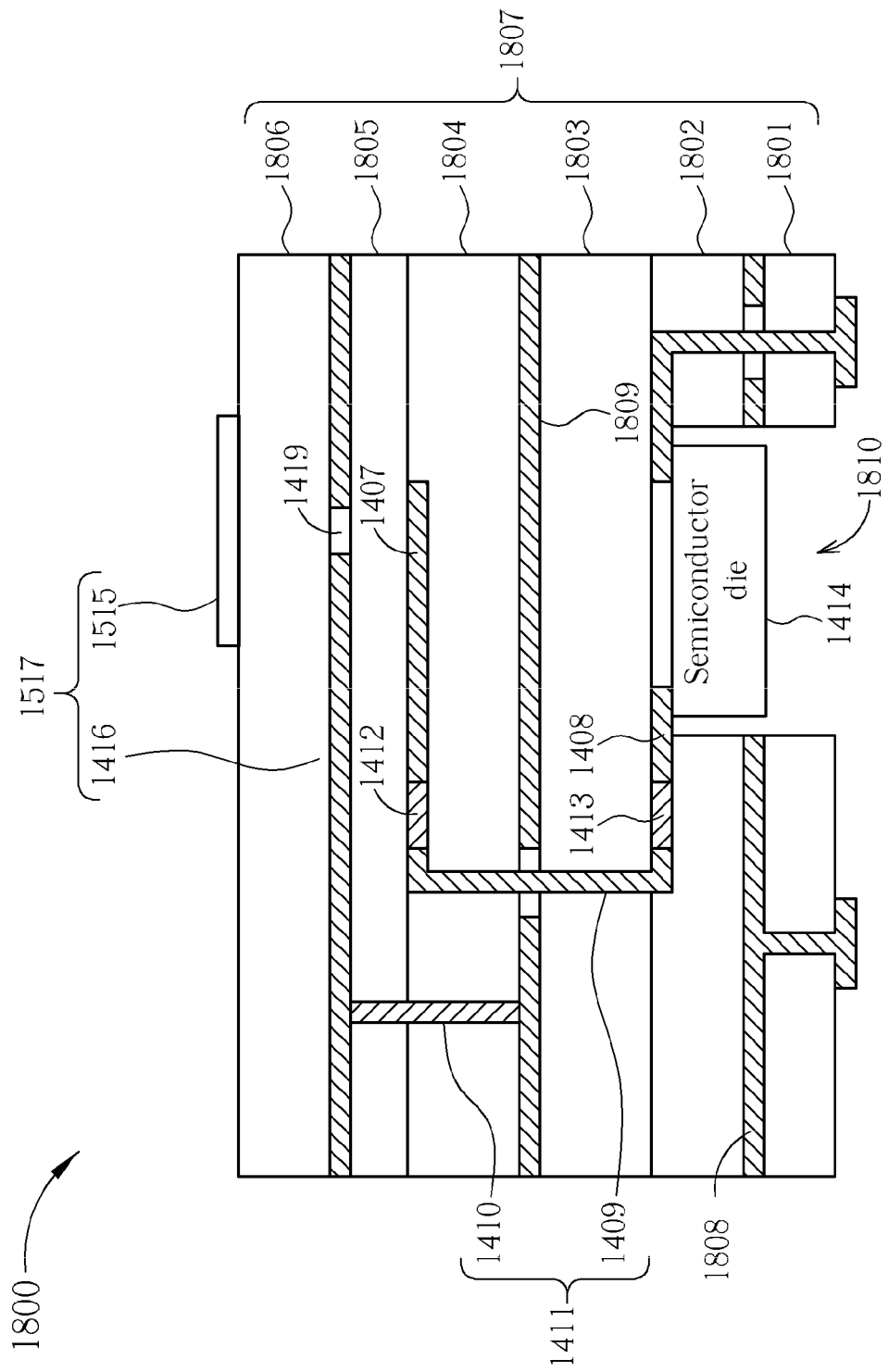
FIG. 18 is a cross-sectional view of a circuit device according to a ninth exemplary embodiment of the present invention.

In above exemplary embodiments shown in FIG. 14-FIG. 17, a semiconductor die is mounted on an external surface (e.g., a bottom surface) of a multilayer circuit carrier. However, with the proposed multilayer signal line transition design, the semiconductor die may be disposed in an open cavity of the multilayer circuit carrier. FIG. 18 is a cross-sectional view of a circuit device according to a ninth exemplary embodiment of the present invention. The exemplary circuit device 1800 has a multilayer circuit carrier 1807 including a plurality of layers 1801-1806. In this exemplary embodiment, the aforementioned aperture-coupled patch antenna 1517 is integrated with the multilayer circuit carrier 1807. However, in an alternative design, another antenna structure may be used. In this exemplary embodiment shown in FIG. 18, a power plane 1808 is disposed between the layers 1801 and 1802, a reflector (or other circuitry) 1809 is disposed between layers 1803 and 1804, and the semiconductor die 1414 is accommodated in an open cavity 1810 of the multilayer circuit carrier 1807 and may be mounted onto the layer 1803 through a flip-chip bonding manner.

Figure 19:
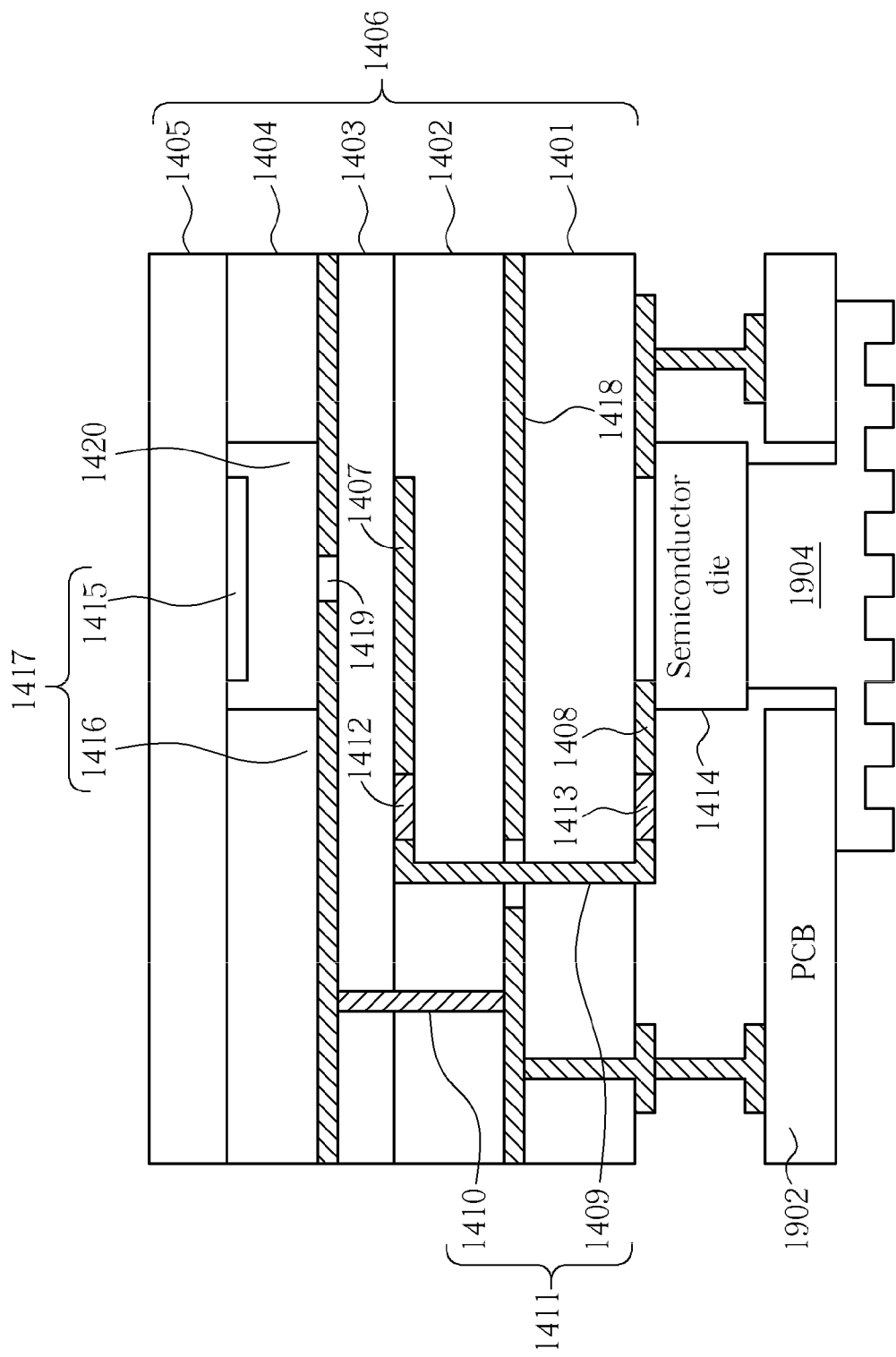
FIG. 19 is a diagram illustrating a circuit device attached to a printed circuit board.
Figure 20:
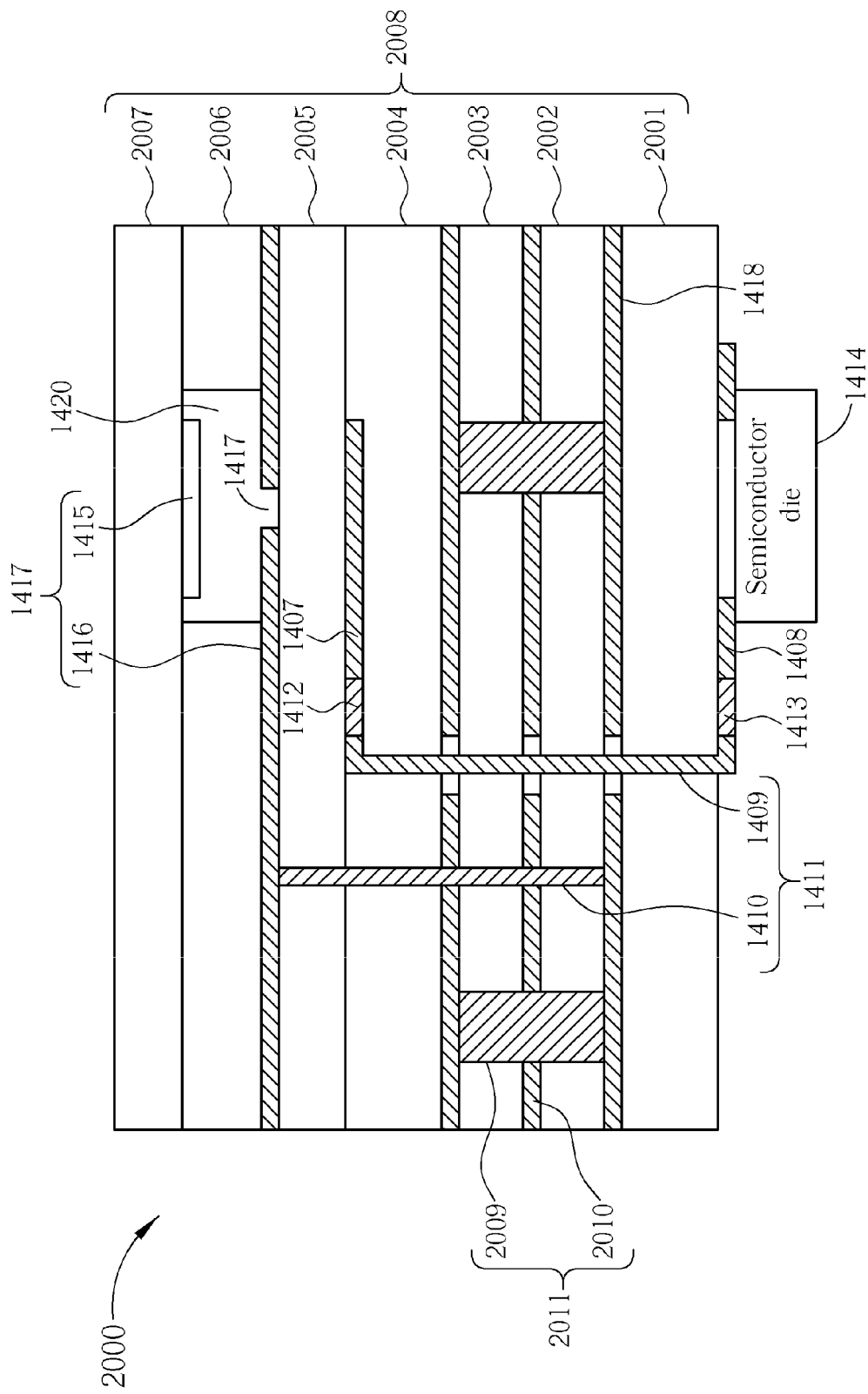
FIG. 20 is a cross-sectional view of a circuit device according to a tenth exemplary embodiment of the present invention.

The proposed circuit device with antenna(s) and/or semiconductor die(s) carried thereon may be further attached to a printed circuit board (PCB). For example, a surface-mount packaging technique, such as a ball grid array (BGA), may be employed to attach the proposed circuit device onto the PCB. Take the exemplary circuit device 1400 for example. FIG. 19 is a diagram illustrating the circuit device 1400 attached to a PCB 1902. If the heat dissipation is an issue to be solved, a heat sink 1904 may be used. However, implementing a heat dissipater inside the proposed circuit device is also feasible. Please refer to FIG. 20, which is a cross-sectional view of a circuit device according to a tenth exemplary embodiment of the present invention. The exemplary circuit device 2000 has a multilayer circuit carrier 2008 including a plurality of layers 2001-2007. The circuit device 2000 is based on the circuit device 1400 shown in FIG. 14, and further has a heat dissipater 2011 integrated in the multilayer circuit carrier 2008. In this exemplary embodiment, the heat dissipater 2011 includes at least one heat dissipation via 2009 and at least one heat dissipation plane (e.g., a ground plane) 2010.

Figure 21:
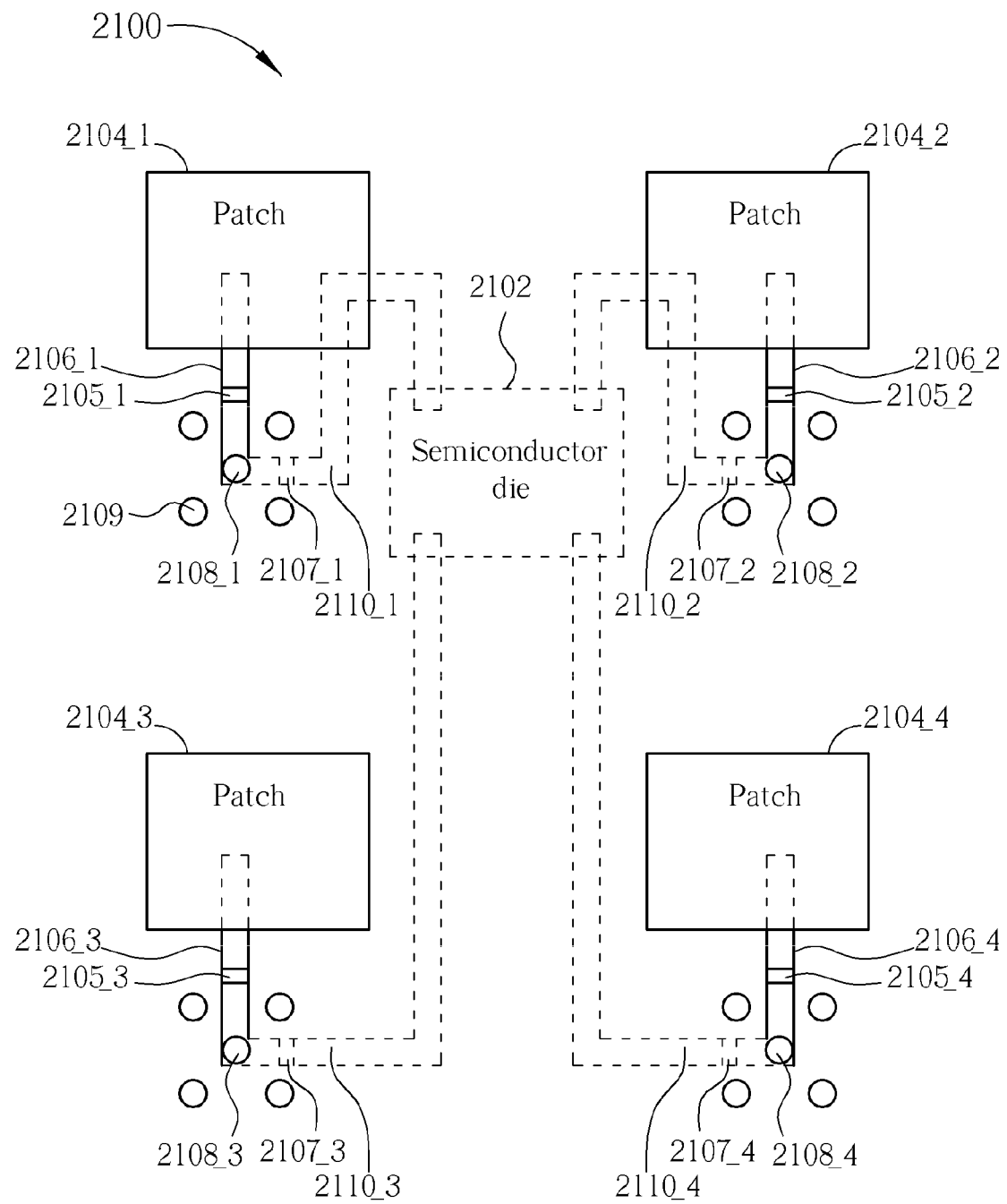
FIG. 21 is a diagram illustrating an exemplary 4-element phased array which uses a proposed signal line transition design to couple a semiconductor die and four antennas.

As mentioned above, the signal routing design can be designed in a systematic way according to embodiments of the present invention. Therefore, the signal routing design is very flexible, which can easily meet the requirements of any application. FIG. 21 is a diagram illustrating an exemplary 4-element phased array (antenna array) which uses the aforementioned multilayer signal line transition design to couple a semiconductor die and four antennas. In this 4-element phased array (antenna array) realized by the exemplary circuit device 2100, four patch antennas are used. Therefore, four patches 2104_1-2104_4 are mounted on a multilayer circuit carrier (e.g., one of the aforementioned multilayer circuit carriers) to which a semiconductor die 2102 with at least the RF signal processing capability is attached. First signal transmission lines (i.e., antenna feed lines) 2106_1-2106_4 are coupled to respective patches 2104_1-2104_4, and also electrically connected to the semiconductor die 2102 through respective first impedance transformers 2105_1-2105_4, respective signal vias 2108_1-2108_4 each passing through multiple layers of the multilayer circuit carrier, respective second impedance transformers 2107_1-2107_4, and respective second transmission lines 2110_1-2110_4. In addition, shielding vias 2109 may be implemented to avoid the unwanted coupling and reduce the undesired signal loss. As a person skilled in the art can readily understand the signal routing design between each patch and the semiconductor die after reading paragraphs directed to above exemplary circuit devices, further description is omitted here for brevity.

As can be seen from FIG. 21, the signal routing design between the patch 2104_1 and the semiconductor die 2102 and the signal routing design between the patch 2104_2 and the semiconductor die 2102 are symmetrical; in addition, the signal routing design between the patch 2104_3 and the semiconductor die 2102 and the signal routing design between the patch 2104_4 and the semiconductor die 2102 are also symmetrical. However, this is for illustrative purposes only. That is, the signal routing designs for the patches 2104_1-2104_4 may be the same or different, depending upon the actual design consideration. Moreover, it should be noted that the proposed multilayer signal line transition design is applicable to a rectangular antenna array, a circular antenna array, a triangular antenna array, etc.

Those skilled in the art will readily observe that numerous modifications and alterations of the device and method may be made while retaining the teachings of the invention.

What is claimed is:

1. A circuit device, comprising:
   a multilayer circuit carrier comprising a plurality of layers including a first layer and a second layer;
   a first signal transmission line, disposed on a surface of the first layer;
   a second signal transmission line, disposed on a surface of the second layer;
   a signal line transition element, passing through at least the first layer and the second layer, the signal line transition element having a first signal terminal formed on the surface of the first layer and a second signal terminal formed on the surface of the second layer;
   a first impedance transformer, disposed on the surface of the first layer and electrically connected between the first signal transmission line and the first signal terminal, for providing impedance matching between the first signal transmission line and the signal line transition element; and
   a second impedance transformer, disposed on the surface of the second layer and electrically connected between the second signal transmission line and the second signal terminal, for providing impedance matching between the second signal transmission line and the signal line transition element.

2. The circuit device of claim 1, wherein at least one of the first impedance transformer and the second impedance transformer is implemented by a quarter wavelength transformer.

3. The circuit device of claim 1, further comprising:
   a line segment, electrically connected between the signal line transition element and one of the first impedance transformer and the second impedance transformer, the line segment arranged to convert complex input impedance of the signal line transition element into purely real impedance viewed by the one of the first impedance transformer and the second impedance transformer.

4. The circuit device of claim 1, wherein the signal line transition element is a coaxial-like transmission line.

5. The circuit device of claim 1, further comprising:
   a heat dissipater, integrated in the multilayer circuit carrier.

6. The circuit device of claim 1, wherein at least one of the first impedance transformer and the second impedance transformer is implemented by a multiple-stub matching network.

7. The circuit device of claim 6, wherein the multiple-stub matching network has a plurality of open-circuited stubs or a plurality of short-circuited stubs.

8. The circuit device of claim 1, wherein at least one of the first impedance transformer and the second impedance transformer is implemented by a single-stub matching network.

9. The circuit device of claim 8, wherein the single-stub matching network has a short-circuited stub or an open-circuited stub.

10. The circuit device of claim 1, wherein the signal line transition element comprises a signal via which passes through at least the first layer and the second layer in a thickness direction of the multilayer circuit carrier, and two ends of the signal via serve as the first signal terminal and the second signal terminal, respectively.

11. The circuit device of claim 10, further comprising:
    a reference voltage plane, disposed on one of the layers and arranged to deliver a predetermined reference voltage;
    wherein the signal via further passes through the reference voltage plane.

12. The circuit device of claim 10, wherein the signal line transition element further comprises:
    a plurality of shielding vias disposed around the signal via, each of the shielding vias arranged to transmit a predetermined reference voltage.

13. The circuit device of claim 1, further comprising:
    an antenna, carried by the multilayer circuit carrier;
    wherein the first signal transmission line is an antenna feed line of the antenna.

14. The circuit device of claim 13, wherein the antenna is a slot antenna.

15. The circuit device of claim 13, wherein the antenna is a patch antenna including a patch disposed on the surface of the first layer and an antenna ground plane, the signal line transition element further passes through the antenna ground plane, and the first signal transmission line is coupled to an edge of the patch.

16. The circuit device of claim 13, wherein the antenna is an aperture-coupled patch antenna including a patch and an antenna ground plane, and the antenna ground plane is disposed between the patch and the antenna feed line and has an aperture.

17. The circuit device of claim 16, wherein the patch is accommodated in an internal cavity of the multilayer circuit carrier.

18. The circuit device of claim 13, further comprising:
    a semiconductor die, mounted on the surface of the second layer and electrically connected to the second signal terminal, wherein the semiconductor die has a radio frequency (RF) signal processing capability.

19. The circuit device of claim 18, wherein the semiconductor die is accommodated in an open cavity of the multilayer circuit carrier.

* * * * *